(12) United States Patent
Robertson et al.

(10) Patent No.: US 7,656,634 B2
(45) Date of Patent: Feb. 2, 2010

(54) INCREASING THE SYSTEM STABILITY AND LIGHTNING CAPABILITY IN A POWER DISTRIBUTION SYSTEM THAT UTILIZES SOLID-STATE POWER CONTROLLERS

(75) Inventors: Nicholas J Robertson, Rockford, IL (US); Donald G. Kilroy, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 469 days.

(21) Appl. No.: 11/606,795

(22) Filed: Nov. 30, 2006

(65) Prior Publication Data

US 2008/0129113 A1 Jun. 5, 2008

(51) Int. Cl.
*H02H 3/08* (2006.01)

(52) U.S. Cl. ............ 361/93.7; 361/93.2; 361/93.4; 361/111

(58) Field of Classification Search ............ 361/111, 361/93.2, 93.4, 93.7; 700/295
See application file for complete search history.

(56) References Cited

U.S. PATENT DOCUMENTS

| 4,349,879 A * | 9/1982 | Peddie et al. ............ 700/295 |
| 5,440,441 A | 8/1995 | Ahuja |
| 5,550,701 A | 8/1996 | Nadd et al. |
| 6,768,350 B1 | 7/2004 | Dickey |
| 2006/0200688 A1 * | 9/2006 | Tofigh et al. ............ 713/300 |

FOREIGN PATENT DOCUMENTS

EP 1298770 4/2003

OTHER PUBLICATIONS

Partial European Search Report dated May 23, 2008.
Chris Hammerton, "TOPFET—A New Concept in Protected MOSFET" Electronic Components and Applications, vol. 10, No. 4, Jan. 1, 1992, pp. 153-168, XP000304697, ISSN: 0141-6219.

* cited by examiner

*Primary Examiner*—Jared J Fureman
*Assistant Examiner*—Terrence R Willoughby
(74) *Attorney, Agent, or Firm*—Carlson, Gaskey & Olds, P.C.

(57) ABSTRACT

An apparatus, and a method of controlling a solid state power controller ("SSPC") selectively allows a current through a solid state power control switch in response to the current in a plurality of SSPCS exceeding at least one threshold. A microprocessor module collects power surge data from a plurality of groups of SSPCs, and determines if the amount of power surge data within a group of SSPCs is sufficient to constitute a lightning threat. If the microprocessor module determines a lightning threat is present, the microprocessor module sends a command to certain SSPCs in the afflicted group to lockout an instantaneous trip protection for the duration of the lightning threat, allowing the power surge to pass from the SSPCs to a load or plurality of loads, leaving the SSPCs undamaged.

21 Claims, 3 Drawing Sheets

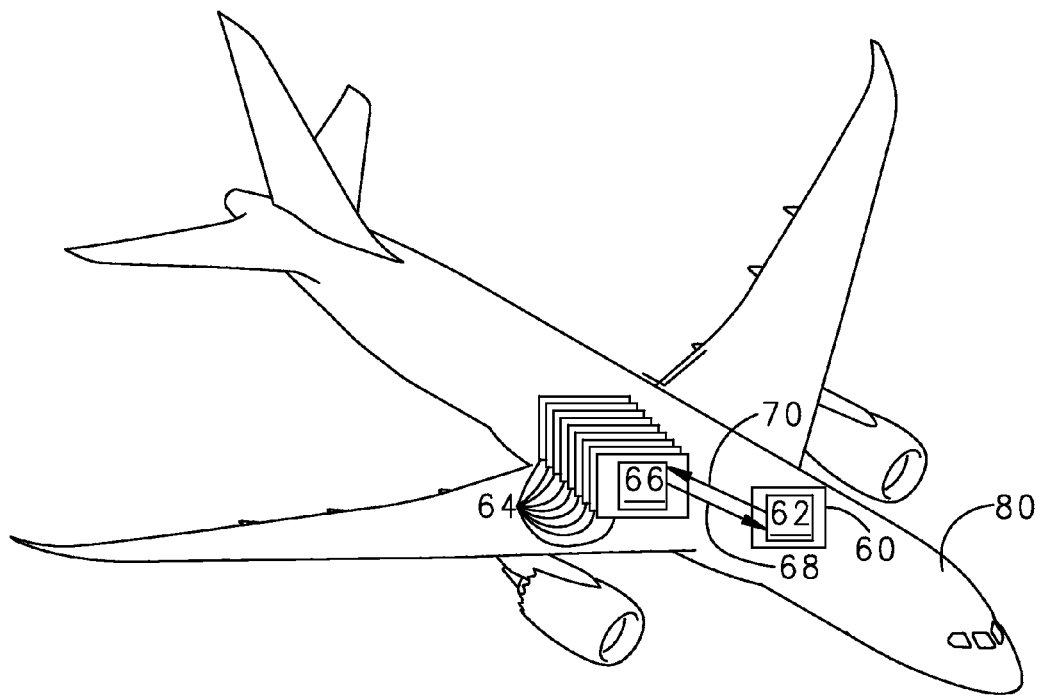
F I G . 3

INCREASING THE SYSTEM STABILITY AND LIGHTNING CAPABILITY IN A POWER DISTRIBUTION SYSTEM THAT UTILIZES SOLID-STATE POWER CONTROLLERS

BACKGROUND OF THE INVENTION

This invention relates generally to vehicle power systems and, more particularly, to solid state power controls.

Vehicles, such as aircraft, typically utilize one or more power distribution units or power modules to distribute power from a primary power source to various vehicle systems. The solid state power controls in a power distribution unit typically include an electronic switch, such as a FET, and electronic circuitry that provides wiring protection. The FET and circuitry are often referred to as a solid state power controller ("SSPC"). The SSPC has found widespread use because of its desirable status capability, reliability, and packaging density. A typical power distribution unit may include hundreds or thousands of SSPCs.

SSPCs also must operate in the presence of lightning, which can adversely impact electronic devices by causing power surges. Traditionally, aircraft had an aluminum skin that attenuated the lightning current induced on the wires. Some aircraft now use composite materials instead of aluminum for weight and strength benefits. However, composite materials do not provide the same level of attenuation to lightning as aluminum. When lightning hits an aircraft chassis, hundreds of volts may surge between a load in the vehicle system and the aircraft chassis. As such, the lightning requirements of SSPCs have increased.

U.S. patent application Ser. No. 11/491,803 entitled "Method to Increase the Lightning Capability In a Solid-State Power Controller", now U.S. Pat. No. 7,626,797, describes a method of operating SSPCs in a high-energy lightning environment. This method enables the SSPC to survive a lightning threat and return a load to its defined state once the threat has passed. The method described in this application is suitable for most single-stroke lightning applications and may be suitable for many multiple-stroke lightning applications. However, additional enhancements can be made to prevent repeated potential cycling off and on under an auto-recover mechanism that is part of this prior system during a multiple-stroke lightning application. The discussion with regard to how this occurs from U.S. patent application Ser. No. 11/491,803 is incorporated herein by reference.

There is a need for a simple, relatively inexpensive SSPC with improved lightning protection, that is suitable for exposure to multiple-stroke lightning, that can operate within a lightning environment with minimal system disruption, and that can protect loads from multiple power cycling.

SUMMARY OF THE INVENTION

SSPC software communicates to a main microprocessor module that a lightning pulse has occurred. The microprocessor module collects and processes this information. If a sufficient number of lightning indications are collected, the microprocessor module notifies other associated SSPCs in the system to lockout an instantaneous trip protection. When their instantaneous trip lockout is engaged, the SSPCs will not trip on lightning current pulses even if the current exceeds an instantaneous trip threshold. This prevents nuisance trips and ensures that current will pass to a load or plurality of loads, leaving the SSPCs undamaged.

These and other features of the present invention can be best understood from the following specification and drawings, the following of which is a brief description.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

FIG. 3 illustrates a plurality of power distribution units and an associated microprocessor module in an example environment of an aircraft.

DETAILED DESCRIPTION OF THE PREFERRED EMBODIMENT

Figure 1:
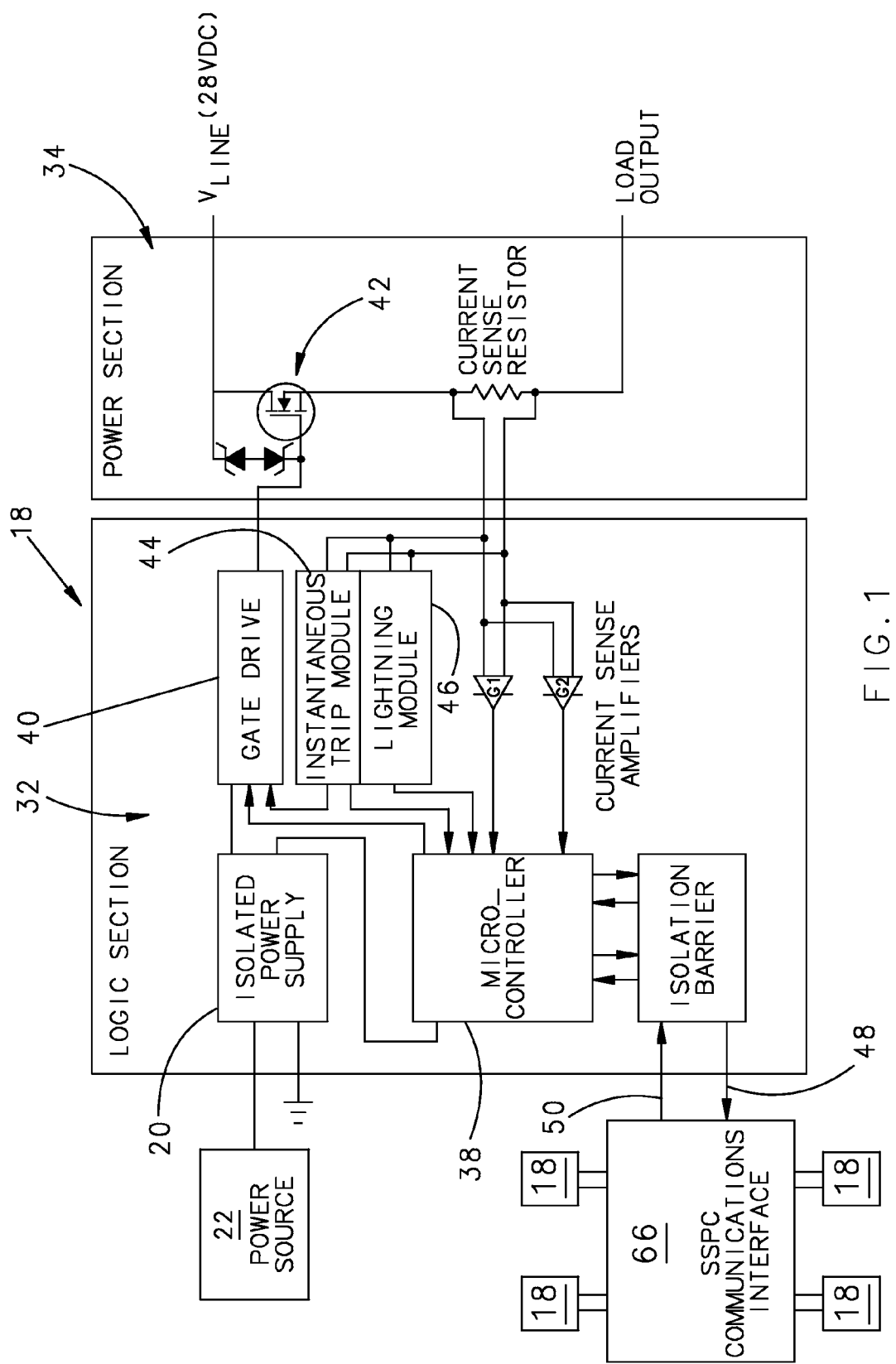
FIG. 1 illustrates selected portions of an example solid state power controller with lightning protection.

FIG. 1 illustrates selected portions of an example solid state power controller (SSPC) 18 for use in a vehicle, such as an aircraft. For the purposes of this discussion a single FET is shown, while in practice it is common to have multiple FETs in parallel. In this example, the SSPC 18 includes a logic section 32 and a power section 34. The logic section 32 includes an isolated power supply 20, which channels power from a power source 22 to a microcontroller 38 and a gate drive 40. The microcontroller 38 controls gate drive 40, which opens and closes a switch 42. When the gate drive 40 is turned on, the switch 42 is closed and the SSPC 18 turns ON. When the gate drive 40 is turned off, the switch 42 is opened and the SSPC 18 turns OFF. Although only one switch 42 is shown in this example, multiple switches may be used in the same manner as described. An instantaneous trip module 44 and a lightning module 46 sense the electrical current flow through the SSPC 18. Instantaneous trip module 44 acts as a comparator, and determines when current meets or exceeds an instantaneous trip threshold. Lightning module 46 also acts as a comparator, and determines when current meets or exceeds a higher lightning threshold. Microcontroller 38 transmits power surge data to an SSPC communications interface 66 via communications line 48. The SSPC communications interface 66 transmits power surge data back to the microcontroller 38 via communications line 50. The SSPC communications interface 66 also communicates with other SSPCs 18.

Under some conditions, such as a lightning strike, a transient current may surge through the vehicle causing a power surge. The transient current may be, for example, an induced current, other known type of transient current, or a transient current from another source besides lightning. In the disclosed example, the SSPC 18 provides lightning protection to reduce the risk that the SSPC 18 becomes damaged from a power surge caused by the transient current. As described in patent application 11/491,803, the following examples illustrate the operation of the instantaneous trip module 44 and the lightning module 46.

In one example, the SSPC 18 is OFF (switch 42 is open) when a transient current occurs. If the transient current meets or increases above an instantaneous trip threshold, the instantaneous trip module 44 turns on the gate drive 40 which then turns ON the switch 42. The switch 42 can handle more transient current when ON because the voltage across the switch 42 will be lower, thus reducing the transient energy that the switch 42 must absorb. The transient current flows to the load during this time to thereby protect the SSPC 18 from damage. As the transient current decreases below the instantaneous trip threshold, the instantaneous trip module 44 removes the gate drive 40 command to force the switch 42 OFF. Optionally, a time delay is used before turning off gate drive 40 to allow the SSPC 18 to cool.

In another example, the SSPC 18 is ON when the transient current occurs. The transient current increases the current through the switch 42 until the instantaneous trip threshold is met or exceeded. At this point, the microcontroller 38 begins to turn OFF the switch 42 and set an auto-recover function. The process of turning OFF the switch 42 takes some time, typically fractions of a second. During this time, the current may increase, decrease, or remain steady.

If the current increases, but not fast enough to meet or exceed the lightning threshold before the switch turns OFF, the switch 42 is turned back ON upon meeting or exceeding the lightning threshold. If the current increases quickly enough to meet or exceed the lightning threshold before the switch 42 turns OFF, the microcontroller 38 cancels the command to turn OFF the switch 42 such that the switch remains ON. In the ON state, the transient current passes to the load to thereby protect the SSPC 18 from damage.

If the transient current decreases or remains steady and does not reach the lightning threshold, the switch 42 turns OFF and the auto-recover logic functions to turn the SSPC 18 back ON after a time delay time to allow cooling.

After the switch 42 is turned back ON, if the current remains above the instantaneous trip threshold but below the lightning threshold, the switch 42 turns OFF and the auto-recover logic again functions to turn the SSPC 18 back ON after another time delay to allow cooling. It is assumed that current above the instantaneous trip threshold is from a shorted load and not lightning if multiple attempts to auto-recover continue to produce current above the instantaneous trip threshold but below the lightning threshold. In response, a protective trip is set in the microprocessor 38, and the SSPC 18 turns OFF.

Thus, the disclosed examples provide for turning the SSPC 18 ON in response to the transient current meeting or exceeding the instantaneous trip threshold or lightning threshold, depending on the initial ON or OFF state of the SSPC 18. This provides the benefit of passing the transient current on to the load to protect the SSPC 18 from damage. Furthermore, the lightning module 46 requires little additional hardware in the SSPC 18, which helps keep costs and packaging density low. Although the SSPC 18 as shown in FIG. 1 is a direct current type, one of ordinary skill in the art who has the benefit of that disclosure will recognize that the disclosed examples are also applicable to alternating current type SSPCs.

Figure 2:
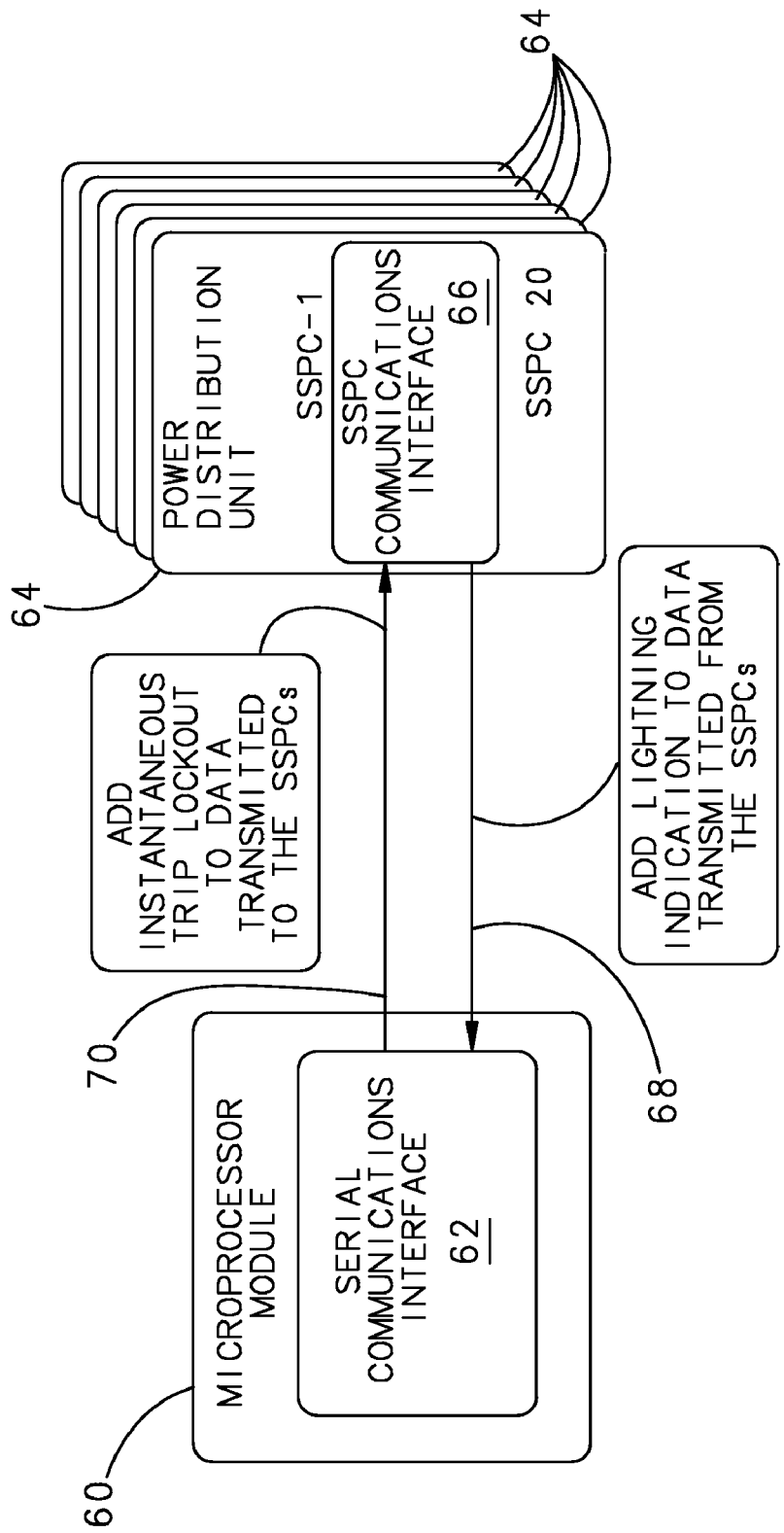
FIG. 2 illustrates a microprocessor module and a plurality of SSPCs that communicate through a serial hardware interface.

FIG. 2 illustrates how a microprocessor module 60 communicates with a plurality of power distribution units 64, which each contain a plurality of SSPCs. The microprocessor module 60 has a serial communications interface 62, and each of the plurality of power distribution units 64 has an SSPC communications interface 66. The power distribution units 64 transmit serial power surge data over communication line 68 to the microprocessor module 60. The microprocessor module 60 transmits serial power surge over communication line 70 to the plurality of power distribution units 64. All of the serial power surge data is communicated between the interfaces 62 and 66.

FIG. 3 illustrates a microprocessor module 60 and a plurality of power distribution units 64 in an example environment of an aircraft. Serial power surge data is transmitted between the microprocessor module 60 and the plurality of power distribution units 64 via communications interfaces 62 and 66 and serial data communication lines 68 and 70.

If certain conditions are met, the SSPC software will notify the microprocessor module 60 that a lightning pulse has occurred. In one example, there are two conditions the microprocessor module 60 will use to determine if lightning has occurred: in a first case if current meets or exceeds an instantaneous trip threshold, and in a second case if current exceeds the instantaneous trip threshold and meets or exceeds a lightning threshold.

In the first case, the current in an SSPC meets or exceeds the instantaneous trip threshold. The microcontroller 38 of the SSPC would then add lightning indication to the power surge data transmitted to the microprocessor module 60 along communication line 68. This case accommodates AC SSPCs that do not have a lightning module.

In the second case, when the lightning threshold has been reached, transient current meets or exceeds the higher lightning threshold of an SSPC. The microcontroller 38 of the SSPC would then add a lightning indication to the power surge data transmitted to the microprocessor module 60 along communication line 68. This case, however, only applies to DC SSPCs, as AC SSPCs do not contain a lightning module to measure the lightning threshold.

When a sufficient number of conditions have been reached within one of the plurality of power distribution units 64, the microprocessor module 60 will command all SSPCs within the power distribution unit that have been commanded ON to lockout their instantaneous trip protection until 1.5 seconds has transpired. The instantaneous trip lockout command is transmitted along with other data to the power distribution unit 64 along communication line 70. An example sufficient number of SSPCs is greater than two, which accommodates the possibility that up to two SSPCs may exceed their instantaneous trip threshold due to a pin-to-pin short circuit, and not due to lightning. The ARP5412A industry standard defines lightning as extending up to 1.5 seconds and including up to 14 pulses randomly spaced between 10 and 200 milliseconds. To accommodate this industry standard, other SSPC functions, such as arc fault protection, can also be inhibited for 1.5 seconds if desired. It would be obvious to one skilled in the art to alter the present invention to meet different industry standards of greater than or less than the 1.5 second lightning duration, or to alter the instantaneous trip 1.5 second lockout time accordingly for this, or other reasons.

An SSPC whose instantaneous trip protection is locked out will allow current to pass from the SSPC to the load, even if that current meets or exceeds the instantaneous trip threshold. By preventing the instantaneous trip and allowing the current to pass to the load, the SSPC is left undamaged. In addition, these locked out SSPCs will not have to repeatedly turn off and back on to check if the lightning threat is still present. By locking out the instantaneous trip protection for the entire 1.5 second duration of the lightning threat, nuisance trips and power cycling is avoided. SSPCs will still follow normal control ON/OFF commands as recited in patent application Ser. No. 11/491,803 during this time. In addition, SSPCs will also maintain wiring protection via the normal SSPC overcurrent trip curve protection during this time. The SSPC overcurrent trip curve protection enables the SSPC to set a circuit breaker protective trip in response to a sufficiently high current.

When the 1.5 second timer of the microprocessor module 60 expires, the instantaneous trip lockout will be reset. Once the lockout is removed, the SSPCs restore their instantaneous trip protection.

In another embodiment of the present invention, the microprocessor module 60 can use other conditions to determine a lightning threat. In one example, when an SSPC experiences multiple instantaneous trips within a predetermined time, it will turn off its SSPC output and set a circuit breaker protective trip by opening a switch 42. In this example, microprocessor module 60 monitors each SSPC for a circuit breaker protective trip. If a sufficient number of circuit breaker protective trips have been activated within a preset defined period, the microprocessor module 60 may reset the tripped SSPCs so that current may pass to a load or plurality of loads, leaving the SSPCs undamaged and reducing the impact to the vehicle from multiple instances of tripped SSPCs from a common cause event such as lightning.

In either of the disclosed embodiments, there is a finite amount of time needed for the microprocessor module 60 to collect power surge data, process that data, and command ON SSPCs to lockout instantaneous trip protection. Depending on timing and the lightning detection method selected, it may also be necessary to reset SSPC circuit breaker protective trips.

Although a preferred embodiment of this invention has been disclosed, a worker of ordinary skill in this art would recognize that certain modifications would come within the scope of this invention. For that reason, the following claims should be studied to determine the true scope and content of this invention.

We claim:

1. A power supply system for a vehicle, comprising:
   a plurality of solid state power controllers;
   at least one power distribution unit, wherein each power distribution unit is associated with a plurality of solid state power controllers;
   at least one solid state power controller communications interface, wherein each solid state power controller communications interface corresponds to a power distribution unit;
   a microprocessor module; and
   a serial communications interface, wherein the serial communications interface corresponds to the microprocessor module, and wherein the solid state power controllers have the ability to either go into a bypass mode or to stop a flow of a current in response to the current in a plurality of associated solid state power controllers meeting or exceeding at least one threshold.

2. The power supply system as recited in claim 1, wherein there is a plurality of solid state power controller communications interfaces.

3. The power supply system as recited in claim 2, wherein there is a plurality of said power distribution units.

4. The power supply system as recited in claim 1, wherein each power distribution unit communicates power surge data to the microprocessor module and receives commands from the microprocessor module via the solid state power controller communications interface associated with the power distribution unit.

5. The power supply system as recited in claim 4, wherein the microprocessor module sends commands to each power distribution unit and receives power surge data via the serial communications interface associated with the microprocessor module.

6. The power supply system as recited in claim 5, further comprising at least one communication line for data transmission between each power distribution unit and the microprocessor module, wherein the at least one communication line connects the serial communications interface to a plurality of solid state power controller communication interfaces in each power distribution unit.

7. The power supply system as recited in claim 1, wherein the solid state power controllers comprise a main switch and an instantaneous trip module, and wherein the instantaneous trip module is operable to either open or close the main switch in response to a current meeting or exceeding a threshold.

8. The power supply system as recited in claim 1, wherein the microprocessor module is able to control the flow of current through each solid state power controller by opening or closing a main switch in each solid state power controller.

9. The power supply system as recited in claim 1, wherein the microprocessor module analyzes power surge data, and is operable to disable an instantaneous trip module protection in a solid state power controller for the duration of a power surge.

10. The power supply system as recited in claim 9, wherein the duration of the power surge is 1.5 seconds.

11. The power supply system as recited in claim 9, wherein the individual solid state power controllers are able to independently set a circuit breaker protective trip if a plurality of instantaneous trips occur in the solid state power controller within a finite time period.

12. A method of controlling a solid state power controller, comprising the steps of:
    selectively allowing a first current through a solid state power control switch in response to a second plurality of associated solid state power control switches meeting or exceeding at least one threshold, the at least one threshold including a first threshold and a second threshold that is greater than the first threshold and the solid state power controller comprising an ON closed state and an Off open state;
    collecting information from a group of solid state power controllers when the first current in any single solid state power controller exceeds the at least one threshold; and
    determining if the quantity of solid state power controllers within the group in which the current exceeds the at least one threshold is sufficient to constitute a lightning threat to the group.

13. The method as recited in claim 12, wherein the first threshold is an instantaneous trip threshold.

14. The method as recited in claim 12, wherein the second threshold is a lightning threshold.

15. The method as recited in claim 12, including disabling the first threshold for the group of solid state power controllers for a duration of a lightning threat if the quantity of solid state power controllers within the group in which the current exceeds the at least one threshold is sufficient to constitute a lightning threat to the group.

16. The method as recited in claim 15, wherein a sufficient quantity of solid state power controllers is three or more solid state power controllers.

17. The method as recited in claim 16, wherein the duration of a lightning threat is 1.5 seconds.

18. The method as recited in claim 12, wherein the at least one threshold is a protective circuit breaker trip activated within a predetermined time.

19. The method as recited in claim 18, wherein a circuit breaker protective trip is activated if a solid state power controller experiences multiple instantaneous trips within a predetermined time.

20. The method as recited in claim 18, wherein a circuit breaker protective trip is reset if multiple solid state power controllers within a group experience circuit breaker protective trips within a predetermined time.

21. The method as recited in claim 18, wherein an arc fault protection is disabled for the duration of a power surge.

\* \* \* \* \*

UNITED STATES PATENT AND TRADEMARK OFFICE
CERTIFICATE OF CORRECTION

| | | |
|---|---|---|
| PATENT NO. | : 7,656,634 B2 | Page 1 of 1 |
| APPLICATION NO. | : 11/606795 | |
| DATED | : February 2, 2010 | |
| INVENTOR(S) | : Robertson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 522 days.

Signed and Sealed this

Fourth Day of January, 2011

David J. Kappos
*Director of the United States Patent and Trademark Office*